United States Patent
Blatchford

(10) Patent No.: US 10,741,489 B2
(45) Date of Patent: Aug. 11, 2020

(54) RECTANGULAR VIA FOR ENSURING VIA YIELD IN THE ABSENCE OF VIA REDUNDANCY

(75) Inventor: James Walter Blatchford, Richardson, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 121 days.

(21) Appl. No.: 13/529,583

(22) Filed: Jun. 21, 2012

(65) Prior Publication Data

US 2013/0069244 A1 Mar. 21, 2013

Related U.S. Application Data

(60) Provisional application No. 61/536,333, filed on Sep. 19, 2011.

(51) Int. Cl.
| | |
|---|---|
| H01L 23/48 | (2006.01) |
| H01L 23/52 | (2006.01) |
| H01L 29/40 | (2006.01) |
| H01L 23/522 | (2006.01) |
| H01L 23/528 | (2006.01) |
| H01L 21/768 | (2006.01) |

(52) U.S. Cl.
CPC .... *H01L 23/5226* (2013.01); *H01L 21/76811* (2013.01); *H01L 21/76816* (2013.01); *H01L 23/528* (2013.01); *H01L 2924/0002* (2013.01)

(58) Field of Classification Search
CPC ......... H01L 21/76811; H01L 21/76816; H01L 21/76897; H01L 23/5226; H01L 23/528
USPC .......................................... 257/774
See application file for complete search history.

(56) References Cited

U.S. PATENT DOCUMENTS

| | | | | |
|---|---|---|---|---|
| 5,506,450 A | * | 4/1996 | Lee ..................... | H01L 23/5226 257/758 |
| 6,011,311 A | * | 1/2000 | Hsing et al. .................. | 257/774 |
| 6,556,453 B2 | * | 4/2003 | Figueroa et al. ............. | 361/763 |
| 6,826,742 B2 | * | 11/2004 | Maeno ................ | G06F 17/5077 257/E23.145 |
| 7,842,975 B2 | * | 11/2010 | Becker ................ | H01L 27/0207 257/204 |
| 8,198,188 B1 | * | 6/2012 | Pierrat ............. | H01L 21/76807 257/758 |
| 8,802,562 B2 | * | 8/2014 | Matsubara ........ | H01L 21/76808 257/758 |

(Continued)

*Primary Examiner* — Dale E Page
*Assistant Examiner* — Wilner Jean Baptiste
(74) *Attorney, Agent, or Firm* — Jacqueline J. Garner; Charles A. Brill; Frank D. Cimino

(57) ABSTRACT

A rectangular via extending between interconnects in different metallization levels can have a planform with a width equal to the width of the interconnects and a length equal to twice the width and can be aligned along a long dimension with a length of the upper interconnect. In an integrated circuit layout, the planform can be centered over the width of the lower interconnect, allowing for misalignment during fabrication while maintaining a robust electrical connection. The bottom of the via may be aligned with an upper surface of the lower interconnect or may include portions below the lower interconnect's upper surface. Fewer adjacent routing tracks are blocked by use of the rectangular via than would be blocked using redundant square vias, while ensuring reliability of the electrical connection despite potential misalignment during fabrication.

16 Claims, 14 Drawing Sheets

(56) References Cited

U.S. PATENT DOCUMENTS

| | | | |
|---|---|---|---|
| 8,994,183 B2* | 3/2015 | Iwasaki | H01L 23/5226 257/774 |
| 2002/0162079 A1* | 10/2002 | Igarashi | G06F 17/5077 257/774 |
| 2003/0214364 A1* | 11/2003 | Cites et al. | 333/33 |
| 2004/0232445 A1* | 11/2004 | Nakamoto | 257/202 |
| 2004/0259349 A1* | 12/2004 | Shimizu | 438/638 |
| 2008/0197494 A1* | 8/2008 | Matsubara | 257/741 |

\* cited by examiner

RECTANGULAR VIA FOR ENSURING VIA YIELD IN THE ABSENCE OF VIA REDUNDANCY

CROSS-REFERENCE TO RELATED APPLICATIONS

This application claims priority to U.S. Provisional Patent Application Ser. No. 61/536,333 filed on Sep. 19, 2011. The content of the above-identified patent document is incorporated herein by reference.

TECHNICAL FIELD

The present application relates generally to connection of conductive layers within an integrated circuit and, more specifically, to a strategy for maintaining via yield in the absence of via redundancy.

BACKGROUND

Vias provide electrical connection of signal lines or conductive regions within different vertical levels in an integrated circuit. Redundant vias, used to improve reliability of interlevel connections, may block an unacceptably high number of adjacent routing tracks. However, the alternative of using minimal numbers of redundant vias may adversely impact die yields.

SUMMARY

A rectangular via extends between interconnects in different metallization levels. The via could have a planform with a width equal to the width of the interconnects and a length equal to twice the width and is aligned along a long dimension with a length of the upper interconnect. In an integrated circuit layout, the planform can be centered over the width of the lower interconnect, allowing for misalignment during fabrication while maintaining a robust electrical connection. The bottom of the via may be aligned with an upper surface of the lower interconnect or may include portions below the lower interconnect's upper surface. Fewer adjacent routing tracks are blocked by use of the rectangular via than would be blocked using redundant square vias, while ensuring reliability of the electrical connection despite potential misalignment during fabrication.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1A:
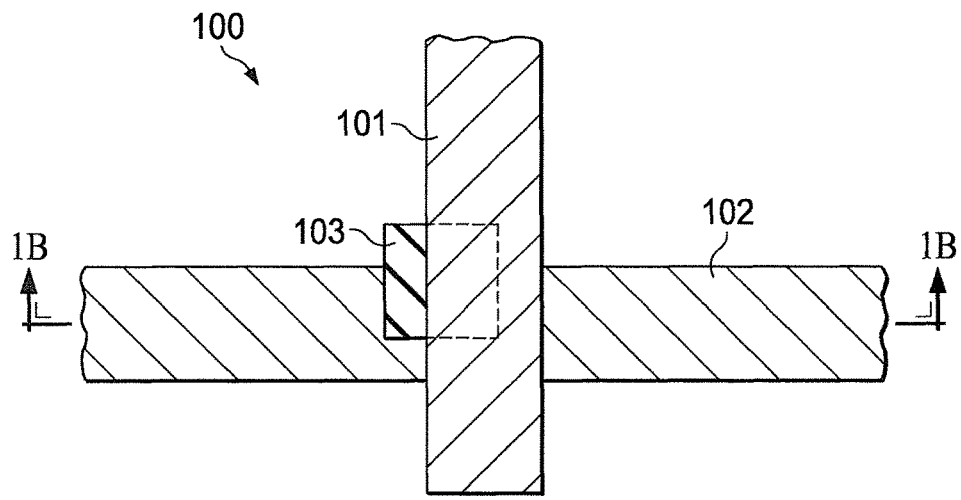
FIGS. 1A and 1B are plan and side sectional views, respectively, of a single misaligned via between interconnects within different metallization levels of an integrated circuit.

FIGS. 1A through 4, discussed below, and the various embodiments used to describe the principles of the present disclosure in this patent document are by way of illustration only and should not be construed in any way to limit the scope of the disclosure.

FIGS. 1A through 1H illustrate different via strategies for providing electrical connection between interconnects within different metallization levels of an integrated circuit. In the drawings of FIGS. 1A through 1H, the cross-hatching for each structure depicted is not intended to indicate material type but is instead selected merely to allow different structures to be more readily differentiated. Moreover, those skilled in the art will recognize that the complete structure of an integrated circuit is neither depicted in FIGS. 1A through 1H nor described here. Instead, for simplicity and clarity, only so much of the structure of an integrated circuit as is unique to the present disclosure or necessary for an understanding of the present disclosure, and of the processes for making such structure(s), is depicted and described here.

Figure 1B:
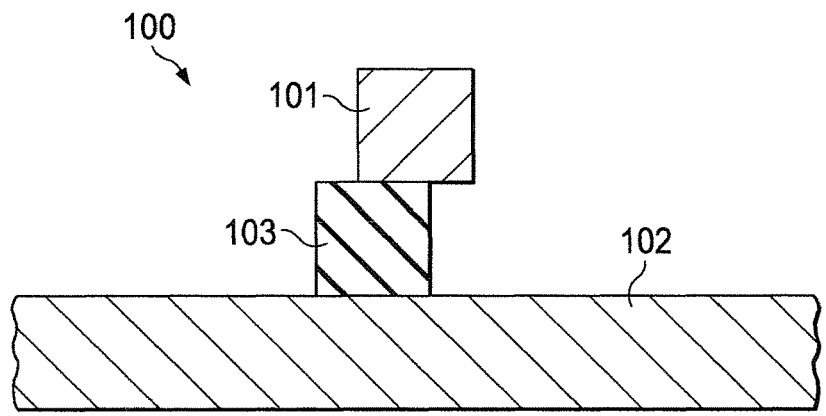

FIGS. 1A and 1B illustrate a single misaligned (generally square) via between interconnects in different metallization levels. FIG. 1B is a side elevation sectional view of the integrated circuit structure depicted in FIG. 1A taken at section line B-B. The integrated circuit structure 100 of FIGS. 1A and 1B includes an upper interconnect 101 in one metallization level, such as metal 3 (MET3), crossing a lower interconnect 102 in a different lower metallization level, such as metal 2 (MET2). The two metallization levels are separated by an interlevel dielectric, which is not specifically depicted in any of FIGS. 1A through 1H. A conductive via 103 is formed vertically within the interlevel dielectric between the two interconnects 101 and 102 in the region of their intersection (seen from above). The via 103 is formed with a generally square cross-section matching the widths (that is, the smaller horizontal dimension as opposed the vertical dimension or "thickness") of the two interconnects 101 and 102. Ideally, the single via would be aligned with the width of both interconnects 101 and 102, but in FIGS. 1A and 1B the via 103 is shown as being misaligned in two directions (although misalignment in a single direction is also possible). As shown, even the slight misalignment depicted here significantly reduces the contact area between the via 103 and each of the interconnects 101 and 102, reducing the reliability of the via in providing an electrical connection. Thus, the misalignment increases the likelihood that the via 103 will not provide the desired electrical connection between the two interconnects 101 and 102.

Figure 1C:
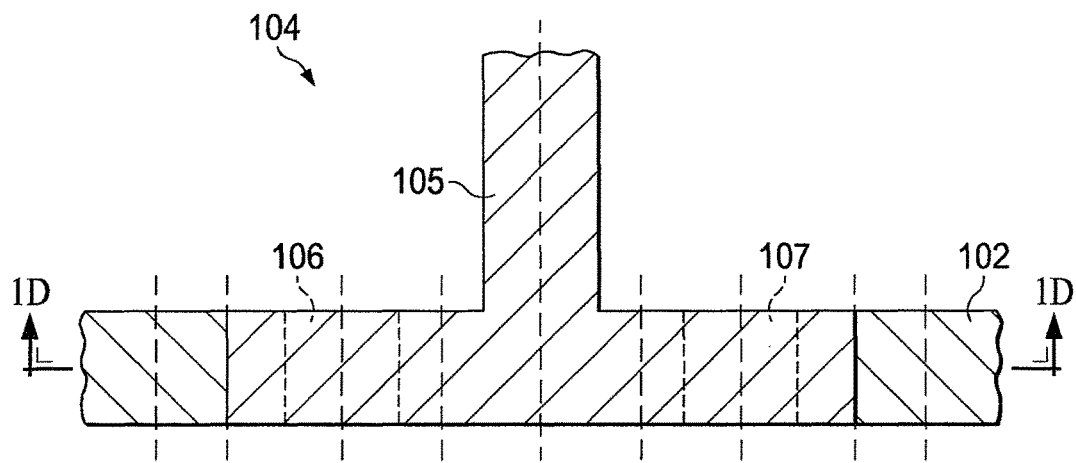
FIGS. 1C and 1D are plan and side sectional views, respectively, of redundant vias between interconnects within different metallization levels of an integrated circuit.
Figure 1D:
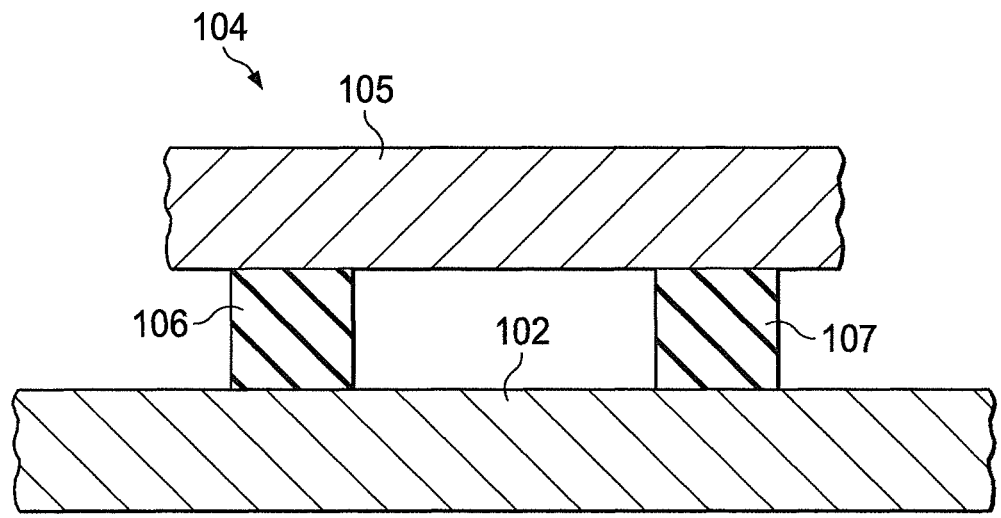

FIGS. 1C and 1D illustrate redundant vias between interconnects in different metallization levels, with FIG. 1D being a side elevation sectional view of the integrated circuit structure depicted in FIG. 1C taken at the section line D-D. As with the integrated circuit structure 100 of FIGS. 1A and 1B, integrated circuit structure 104 includes an upper interconnect 105 in one metallization level above a lower interconnect 102 in a different metallization level, separated by an interlevel dielectric. In this example, a line-end via connection (that is, a connection at a terminus of one of the two interconnects) is illustrated, and no misalignment of the via connections is depicted.

For advanced nodes, via gridding restrictions are typically required to ensure acceptable process margins, such that the addition of redundant vias where possible is very desirable to ensure good yield and reliable electrical connection. In laying out redundant vias, in order to enforce an absolute grid with vias centered on route tracks, one of the upper or lower interconnect structures is changed to include a cross- or T-shaped planform at the point of intersection for the two interconnects, with extensions aligned with the length of the other interconnect. Two square vias 106 and 107 collectively provide electrical connection of those extensions to the other interconnect. In the example of FIGS. 1C and 1D, the structure of the upper interconnect 105 includes T-shaped extensions (for a line-end electrical connection between the interconnects), and the two vias 106 and 107 physically (and electrically) connect the two interconnects 105, 102 along the length of interconnect 102.

In the presence of gridding restrictions, redundant vias may lead to extreme track blockage for at least one of the metallization layers since, as noted above, the T- or cross-shaped structure is generated in one of the metallization layers. The extensions for the T- or cross-shape "block" (that is, prevent usage of) multiple adjacent route tracks in the metal layer. When metal line-end electrical connection rules are considered, the resulting T-shaped structure blocks up to five adjacent route tracks. The potential for blocking adjacent routing tracks is especially problematic for metal layers where very large line-end spacings are required and can result in up to seven adjacent route tracks being blocked, as indicated by the vertical dotted lines in FIG. 1C. Since redundant via insertion is done "after the fact" for a circuit layout in which signal routing is already complete, the probability of being able to insert a seven-track-wide redundant via is very low, such that yields may suffer.

Figure 1E:
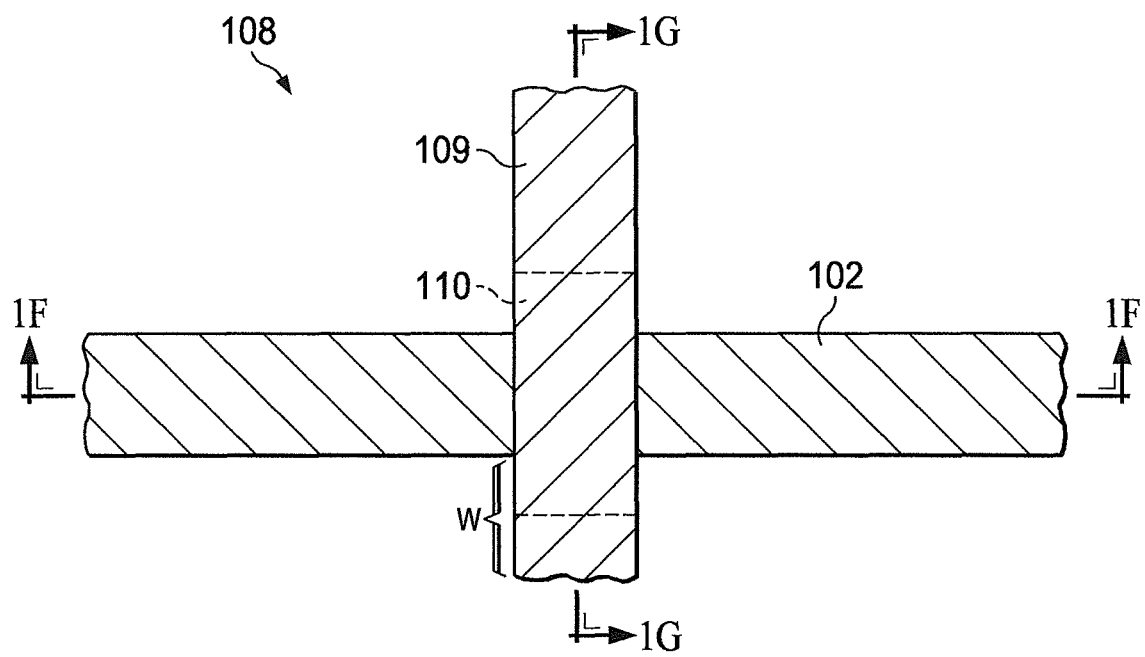
FIG. 1E is a plan view and FIGS. 1F through 1H are side sectional views of a single rectangular via between interconnects within different metallization levels of an integrated circuit according to one embodiment of the present disclosure.
Figure 1F:
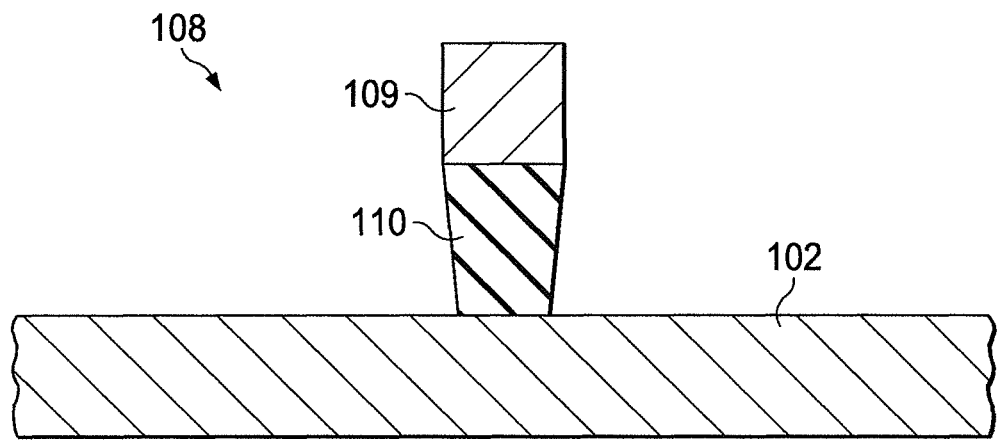
Figure 1G:
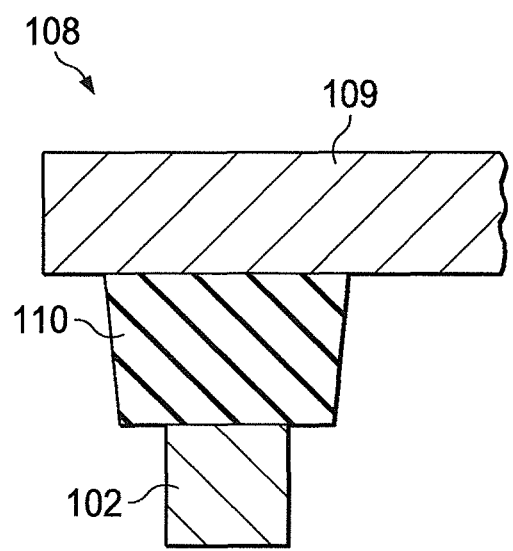
Figure 1H:
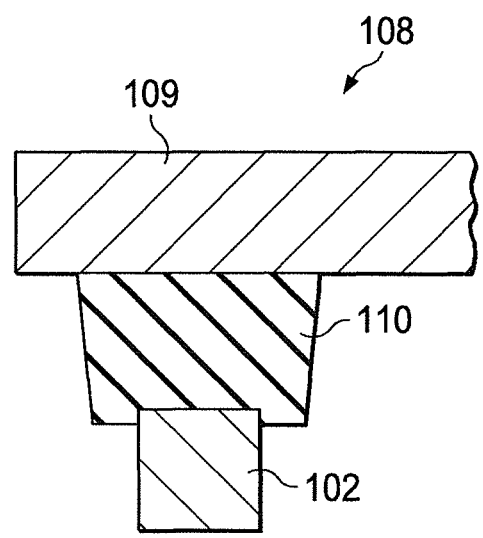

FIG. 1E is a plan view and FIGS. 1F through 1H are side elevation sectional views of a single rectangular via between interconnects within different metallization levels of an integrated circuit according to one embodiment of the present disclosure. FIG. 1F is a side elevation sectional view of the integrated circuit structure depicted in FIG. 1E taken at section line F-F, while FIGS. 1G and 1H are alternate side elevation sectional views of the integrated circuit structure depicted in FIG. 1E taken at section line G-G. As with the integrated circuit structures 100 and 104 of FIGS. 1A through 1D, integrated circuit structure 108 includes an upper interconnect 109 in one metallization level above a lower interconnect 102 in a different metallization level, separated by an interlevel dielectric. In this example, a line-end via connection is again illustrated, and no misalignment of the via connection is depicted.

The upper interconnect 109 within the higher metallization level extends past the line-end edge of the lower interconnect 102 by a distance approximately equal to the width W of the interconnects 102, 109. A conductive via 110 has a rectangular planform, such as a 2×1 rectangular planform with a width approximately equal to the width of the interconnects 102, 109 and a length approximately equal to twice the width of the interconnects 102, 109. A precise 2×1 planform is not required; the width of the via may to some extent exceed or be narrower than the width of the interconnects, and the length of the planform may exceed or be smaller than twice the interconnect width. The long dimension of the rectangular planform for via 110 can be aligned with the length of the upper interconnect 109 and can be centered over the lower interconnect 102. The resulting via connection to the lower interconnect 102 is more robust than a comparable connection with a single square via.

The sidewalls of the opening through the interlevel dielectric for via 110 may be expected to be slightly sloped or battered—that is, having a non-zero angle (most likely less than about 10° to 15°) with respect to the vertical. During fabrication of the rectangular via 210, the etchant used to etch the via opening through the interlevel dielectric above the lower interconnect 102 can be sufficiently selective and controlled to allow the etch to be stopped when the upper surface of the interconnect 102 is exposed within the via opening. In this way, the via 110 formed by filling the via opening (such as with a barrier and/or seed layer followed by electroplating) has a bottom surface even with and contacting the top of interconnect 102 as depicted in FIG. 1G. An etch stop layer between interlevel dielectrics may be employed to assist in providing the requisite control. However, slight over-etching may be preferred to under-etching, and even with a tightly controlled etch the resulting via opening may extend slight below the top of interconnect 102 on both sides. The via 110 formed by filling such a via opening would thus extend slightly around the upper edges of the lower interconnect 102 as depicted in FIG. 1H.

The rectangular via 110 of the present disclosure differs from self-aligned vias, which align the via opening to the lower interconnect within the pair (i.e., to interconnect 102 in the examples described above). The result, from a plan view, is a square via opening, although the sidewalls may be slightly sloped or battered as with the rectangular via opening described above. As discussed above, the rectangular via 110 can be aligned with the upper interconnect of the pair. Minor misalignment of the via opening with either interconnect 102, 109 can be more easily tolerated than with a square via. Misalignment across the width of the lower interconnect 102 is easily absorbed since, even with the sloped sidewalls, the bottom surface of the via 110 has a length substantially greater than the width of the lower interconnect 102. Misalignment across the width of the upper interconnect is also more easily tolerated since the length of the rectangular via 110 ensures adequate contact area between the misaligned via 110 and the upper interconnect 109 to ensure reliable electrical connection.

By aligning the long dimension of the rectangular via 110 with the length of the upper interconnect 109, blocking of adjacent routing tracks in that metallization layer is avoided. Likewise blocking of adjacent route tracks in the lower metallization layer is reduced. At most, three adjacent routing tracks for the metallization layer of the lower interconnect 102 may be blocked by the dimensions of a 2×1 rectangular via 110, even under line-end rules. As with redundant vias, the placement of 2×1 or other rectangular vias may be done after the fact, replacing planned square single vias on a space available basis once all signal routing is complete.

FIGS. 2A through 2J and 3A through 3J depict portions of an integrated circuit during various phases of fabricating a single rectangular via between interconnects within different metallization levels of an integrated circuit according to embodiments of the present disclosure. As with FIGS. 1A through 1H above, for simplicity and clarity, only so much of the structure of an integrated circuit as is unique to the present disclosure or necessary for an understanding of the present disclosure, and of the processes for making such structure(s), is depicted and described here.

FIGS. 2A-2J and 3A-3J illustrate how 2×1 rectangular vias may be integrated into a metallization process flow utilizing with a metal hardmask. In the example described, the lower interconnect is formed, then an interlevel dielectric layer is deposited, followed by a sacrificial hardmask material (usually metal). The pattern for the upper level interconnects is transferred into the hardmask material (forming trenches therein), and then the pattern for rectangular vias is formed over the etched upper level trench in the hardmask material and transferred into the interlevel dielectric material. Finally, the upper level interconnect pattern from the hardmask material is transferred to the dielectric.

For this process flow, the via etch can be performed so as to be either selective or non-selective to the hardmask material. If selective, the via can be slightly oversized in the shorter (width) dimension to account for the via-to-metal misalignment tolerance, typically about 5 nanometers (nm) for advanced nodes.

Figure 2A:
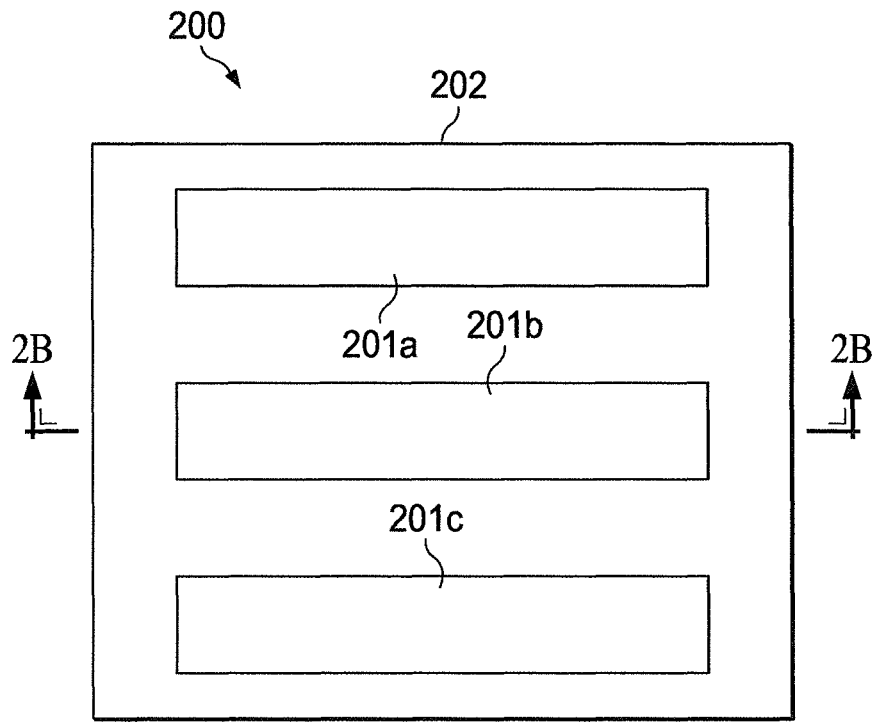
FIGS. 2A, 2C, 2E, 2G and 2I are plan views
Figure 2B:
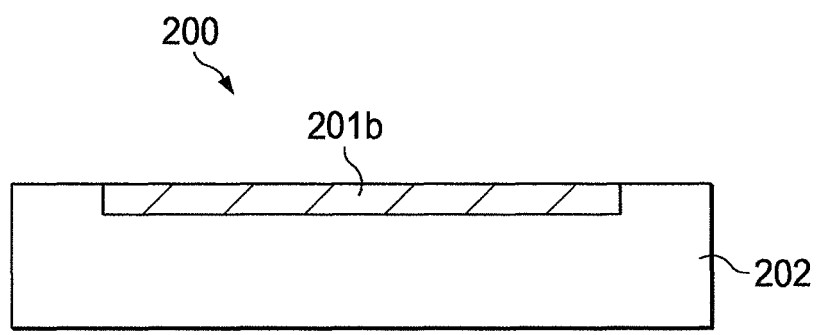
FIGS. 2B, 2D, 2F, 2H and 2J are side sectional views of portions of an integrated circuit during various phases of fabricating a single rectangular via between interconnects within different metallization levels of an integrated circuit according to one embodiment of the present disclosure.
Figure 3A:
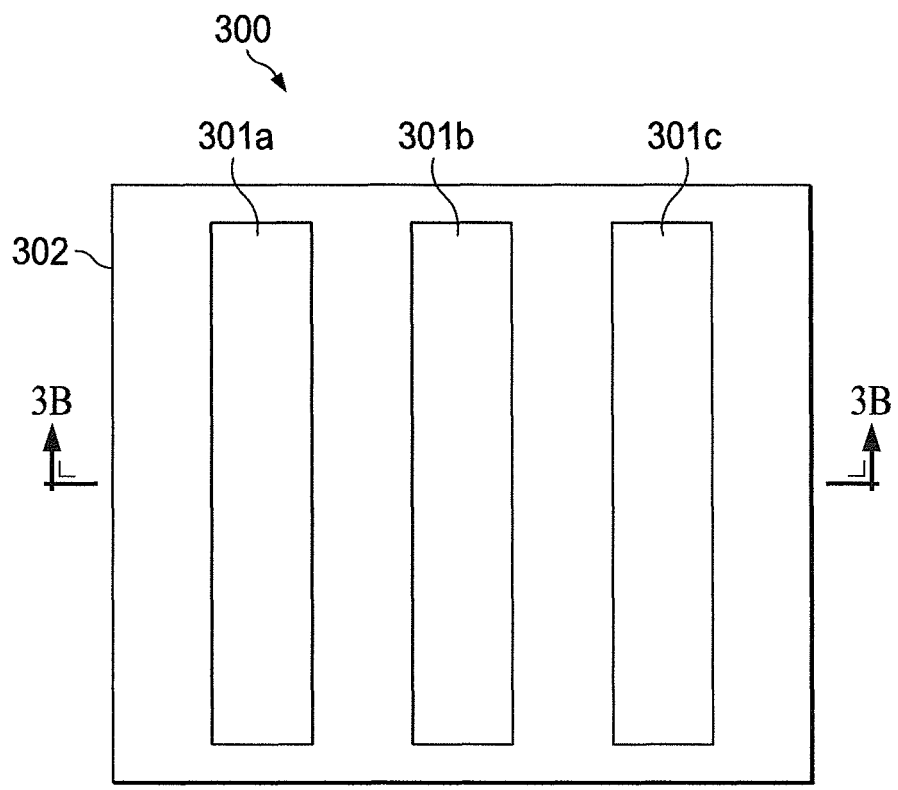
FIGS. 3A, 3C, 3E, 3G and 3I are plan views
Figure 3B:
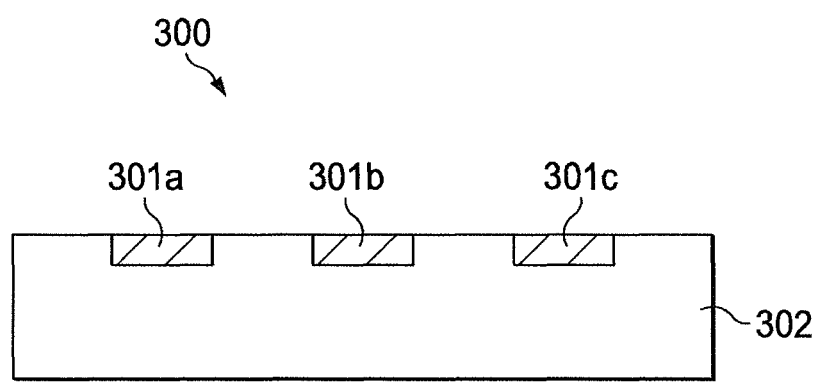
FIGS. 3B, 3D, 3F, 3H and 3J are side sectional views of portions of an integrated circuit during various phases of fabricating a single rectangular via between interconnects within different metallization levels of an integrated circuit according to one embodiment of the present disclosure.

FIGS. 2A and 3A are plan views of a portion of an integrated circuit 200 and 300, respectively, while FIGS. 2B and 3B are side sectional views of the structure of FIGS. 2A and 3A, respectively, each taken at section line B-B. Each integrated circuit portion 200, 300 depicts portions of interconnects 201a, 201b and 201c and 301a, 301b and 301c within a second metallization level MET2. The interconnects 201a-201c and 301a-301c are formed on and separated by portions of an interlevel dielectric 202, 302. The interlevel dielectric 202, 302 is formed on other portions of the integrated circuit (not shown), including a substrate in which are formed active devices electrically connected by the interconnects 201a-201c and 301a-301c. The interconnects 301a-301c in FIG. 3A are shown with a different orientation than the interconnects 201a-201c in FIG. 2A, to facilitate description of the single rectangular vias between interconnects within different metallization levels according to embodiments of the present disclosure.

Figure 2C:
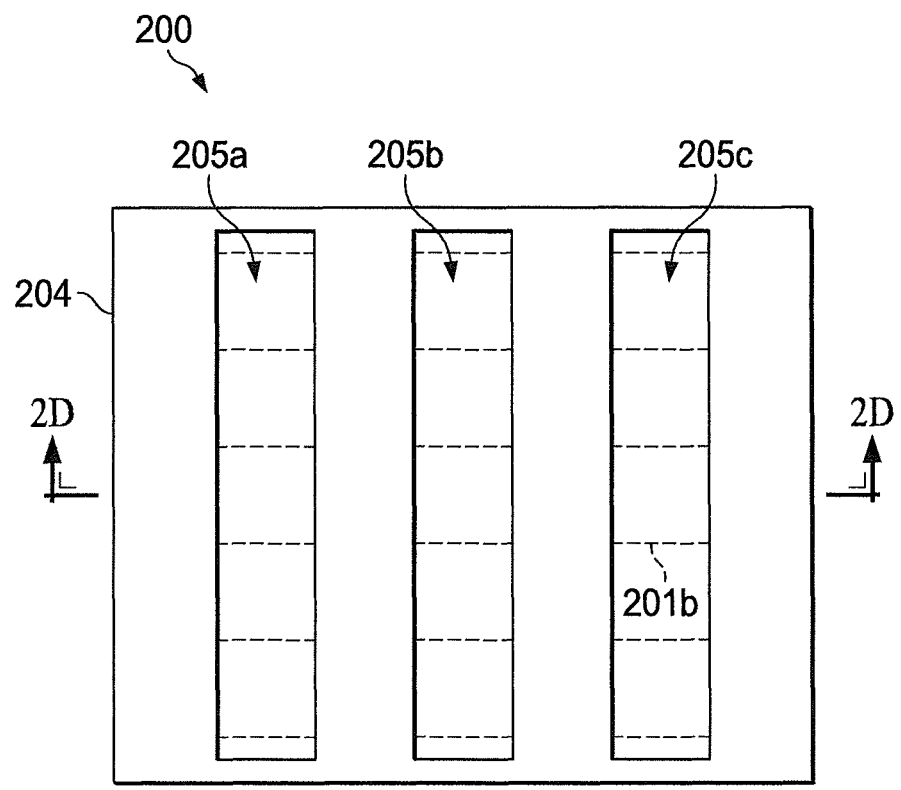
Figure 2D:
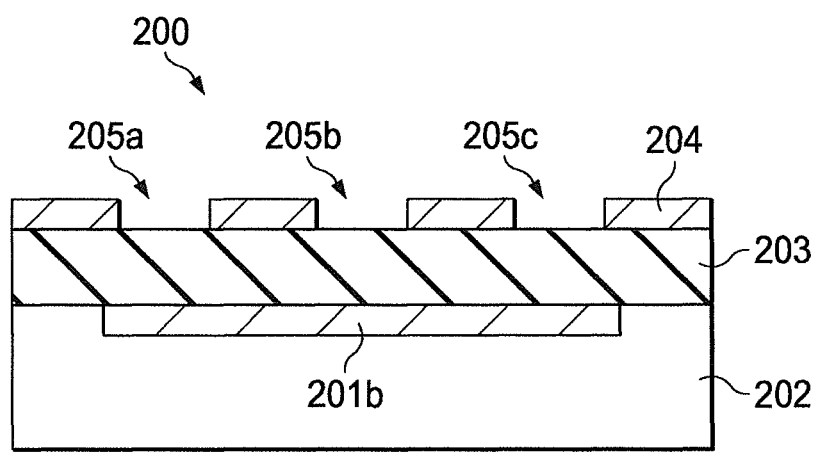
Figure 3C:
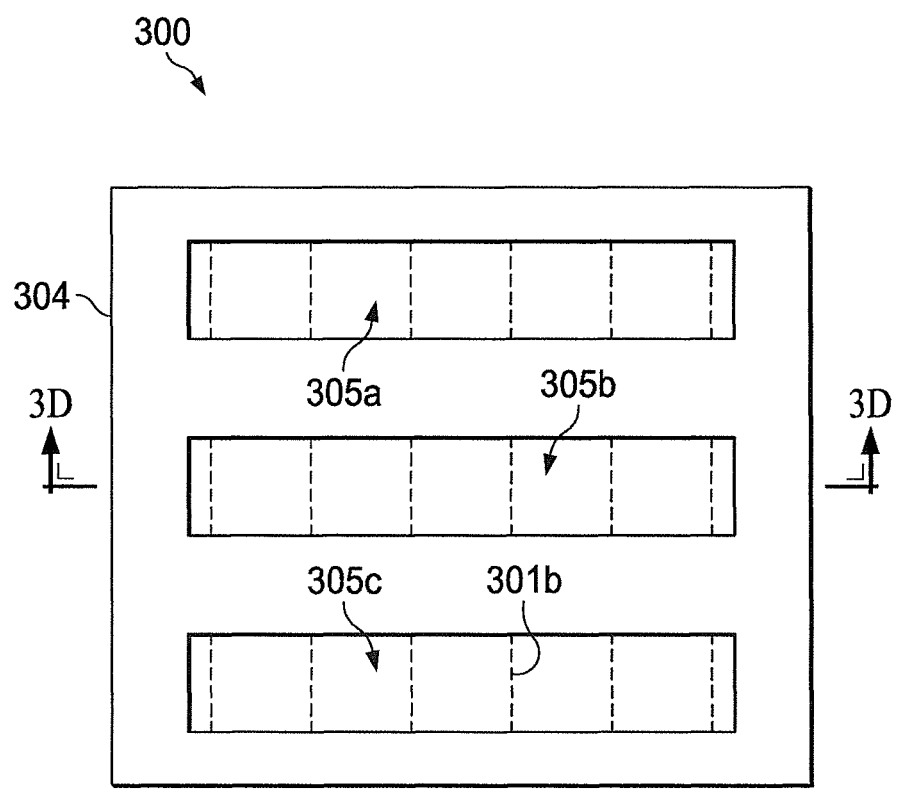
Figure 3D:
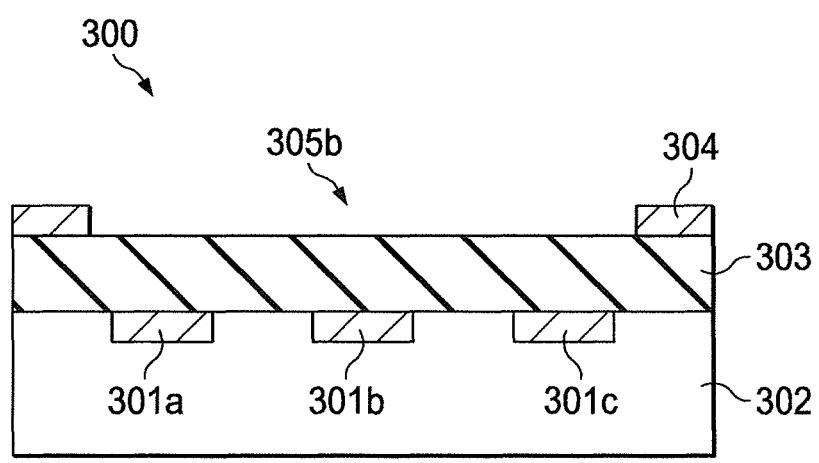

FIG. 2C is a plan view of the portion 200 of an integrated circuit after additional processing; likewise FIG. 3C is a plan view of the portion 300 of an integrated circuit after the same additional processing. FIGS. 2D and 3D are side sectional views of the structure of FIGS. 2C and 3C, respectively, each taken at section line D-D. At the stage of fabrication illustrated in FIGS. 2C-2D and 3C-3D, a second interlevel dielectric 203, 303 has been formed over the interlevel dielectric 202, 302 and on the interconnects 201a-201c and 301a-301c. The second interlevel dielectric 203, 303 electrically isolates the second and third metallization levels MET2 and MET3. The second interlevel dielectric 203, 303 is formed to a controlled thickness that may be accurately etched, and/or may optionally be separated in areas from interlevel dielectric 202, 302 by a patterned etch stop layer (not shown).

Also illustrated in FIGS. 2C-2D and 3C-3D is a hard mask 204, 304 into which the metal pattern for the third metallization layer MET3 has been etched. The hard mask 204, 304 is formed of a material that may be selectively etched with respect to interlevel dielectric 202, 302 and interlevel dielectric 203, 303. The hard mask 204, 304 includes openings 205a, 205b and 205c and 305a, 305b and 305c etched therethrough in regions where interconnects will be placed in the third metallization level MET3. The location of interconnects 201a-201c and 301a-301c below the openings 205a-205c and 305a-305c is shown in phantom in FIGS. 2C and 3C for clarity, although the portions of the interconnects 201a-201c and 301a-301c shown are not actually exposed by the openings 205a-205c and 305a-305c, but remain covered by interlevel dielectric 203, 303. In the exemplary embodiments being described, a single rectangular via will be formed between opening 205b and interconnect 201b and between opening 305b and interconnect 301b.

Figure 2E:
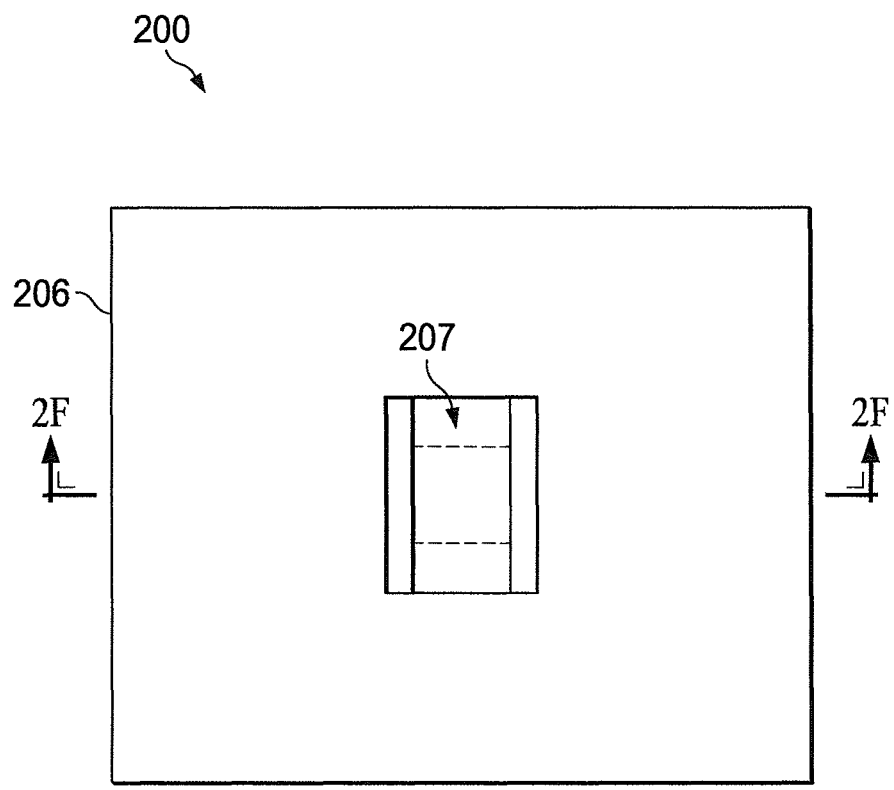
Figure 2F:
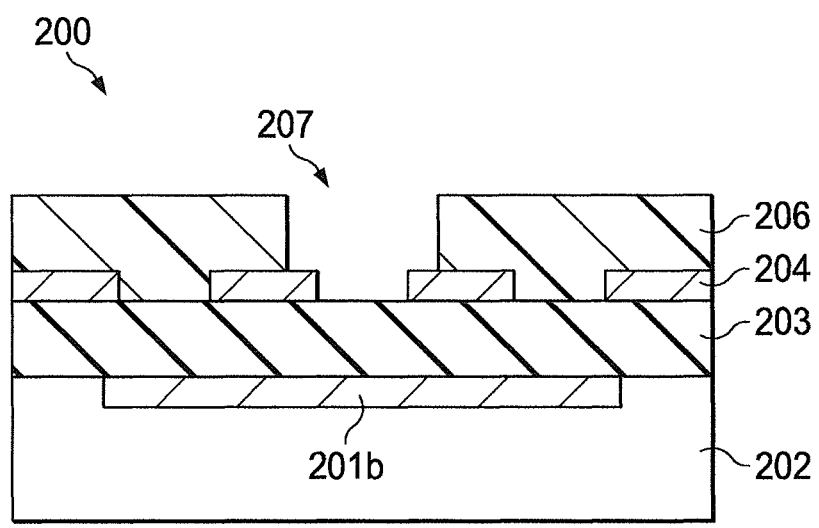
Figure 3E:
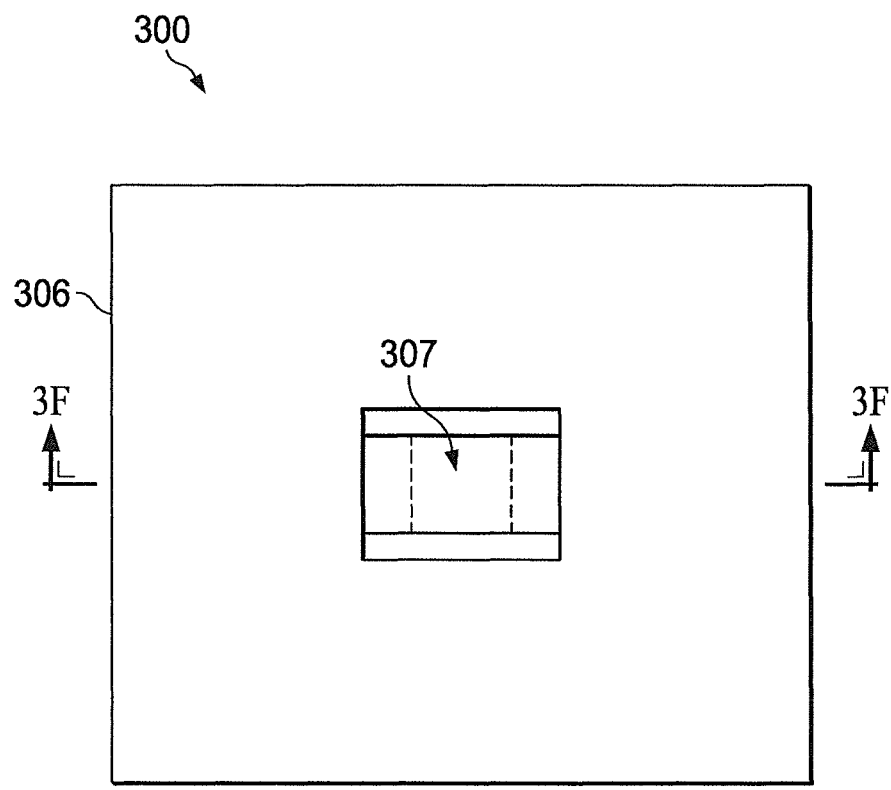
Figure 3F:
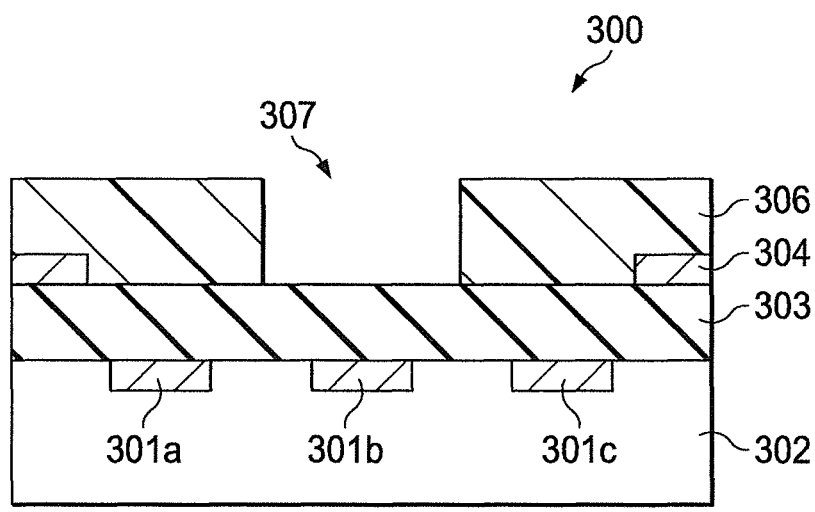

FIG. 2E is a plan view of the portion 200 of an integrated circuit after formation and patterning of an etch mask (e.g., a resist or sacrificial layer) for selective etching of the via openings; likewise FIG. 3E is a plan view of the portion 300 of an integrated circuit after the same formation and patterning of an etch mask for selective etching of the via openings. FIGS. 2F and 3F are side sectional views of the structure of FIGS. 2E and 3E, respectively, each taken at section line F-F. The etch mask 206, 306 is formed on the hard mask 204, 304 and on exposed portions of the interlevel dielectric 203, 303. The etch mask has been patterned to leave openings 207, 307 exposing the interlevel dielectric 203, 303 in areas that will be etched to form the rectangular vias. As seen in the drawings, the openings 207, 307 are sized to produce via openings that have a length of about twice the width of the interconnects 201a-201c and 301a-301c, and with a width approximately equal to the width of the interconnects 201a-201c and 301a-301c. In the example depicted, the openings 207, 307 are sized to produce via openings that are slightly oversized in the width dimension—that is, slightly wider than the width of the interconnects 201a-201c and 301a-301c. Again, the location of interconnects 201b and 301b below the openings 207 and 307 is shown in phantom in FIGS. 2E and 3E, although those portions of the interconnects 201b and 301b shown are not exposed through openings 207 and 307 and openings 205b and 305b.

Figure 2G:
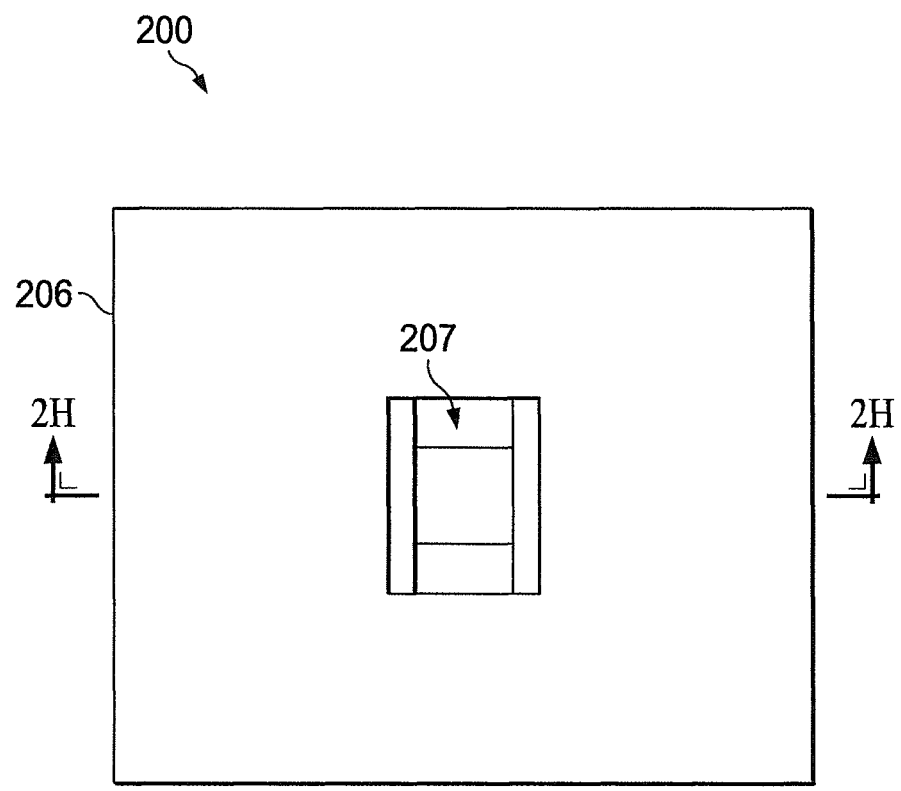
Figure 2H:
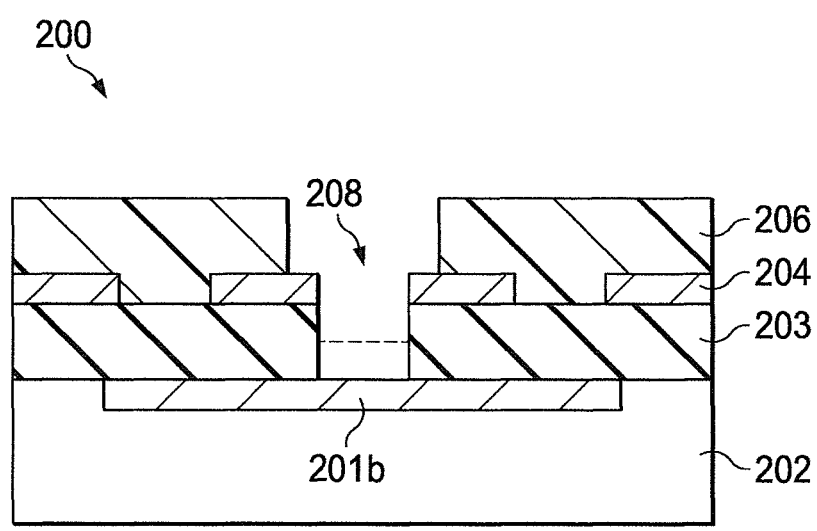
Figure 3G:
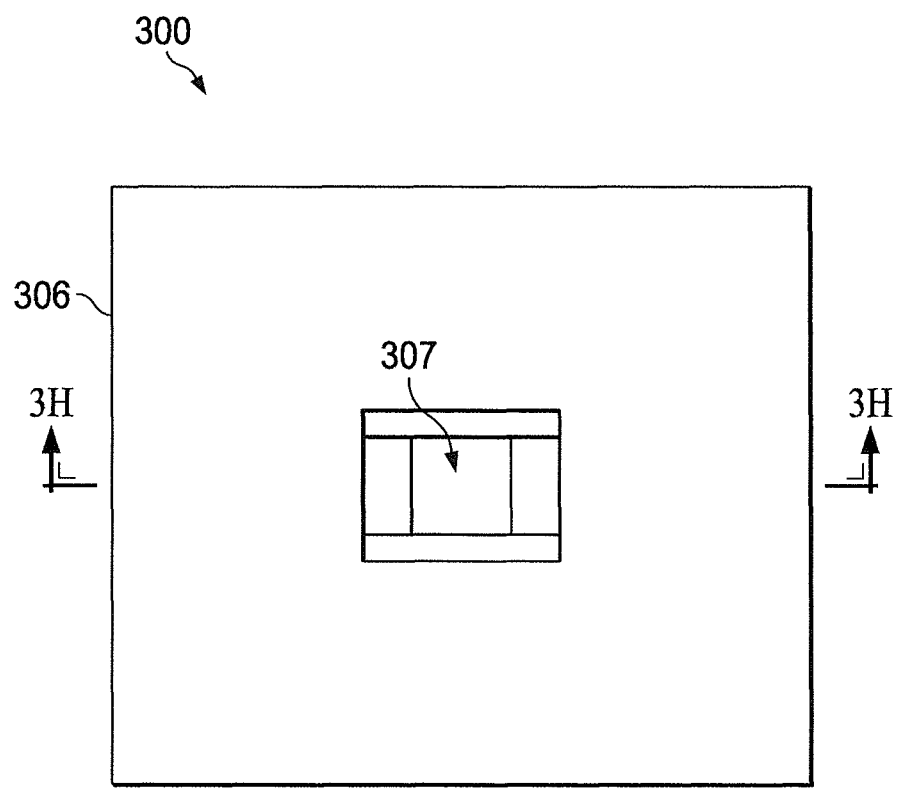
Figure 3H:
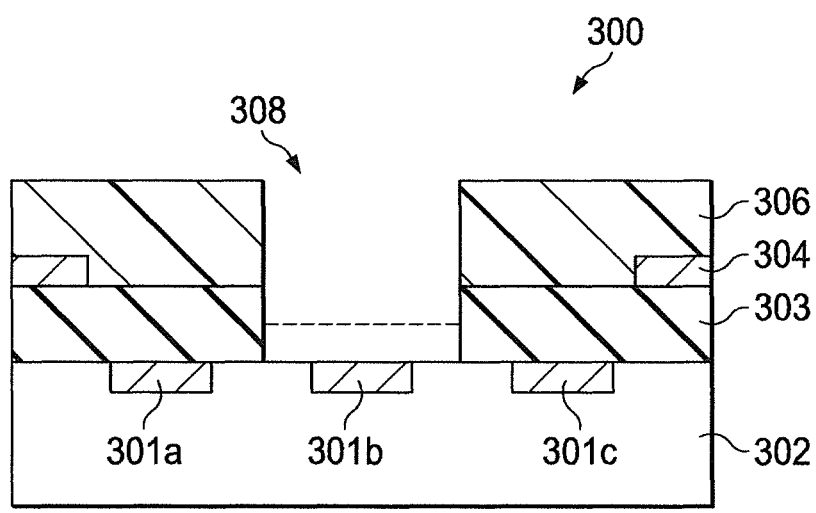

FIGS. 2G and 3G are plan views of the portions 200, 300 of an integrated circuit after etching of the rectangular via opening, and FIGS. 2H and 3H are side sectional views of the structure of FIGS. 2G and 3G, respectively, each taken at section line H-H. The rectangular via openings 208, 308 are etched through (or at least partially through) interlevel dielectric 203, 303 to expose portions of interconnects 201b, 301b and adjoining regions of interlevel dielectric 202, 302. An etch selective to the hard mask 204, 304 is preferably employed, and controlled to stop once the upper surfaces of interconnects 201b, 301b are exposed (or, alternatively, used to slightly over-etch into the adjoining regions of interlevel dielectric 202, 302 as described above). It should be noted that the openings 208, 308 need not be etched completely through dielectric 203, 303 at this time. Instead, as shown in phantom in FIGS. 2H and 3H, the openings 208, 308 may be etched to a depth leaving a thickness of dielectric corresponding to the thickness that will be removed to transfer the upper level interconnect pattern of the hardmask 204, 304 into the dielectric 203, 303. The openings 208, 308 for the vias may then be completely etched through when the interconnect pattern is transferred.

Figure 2I:
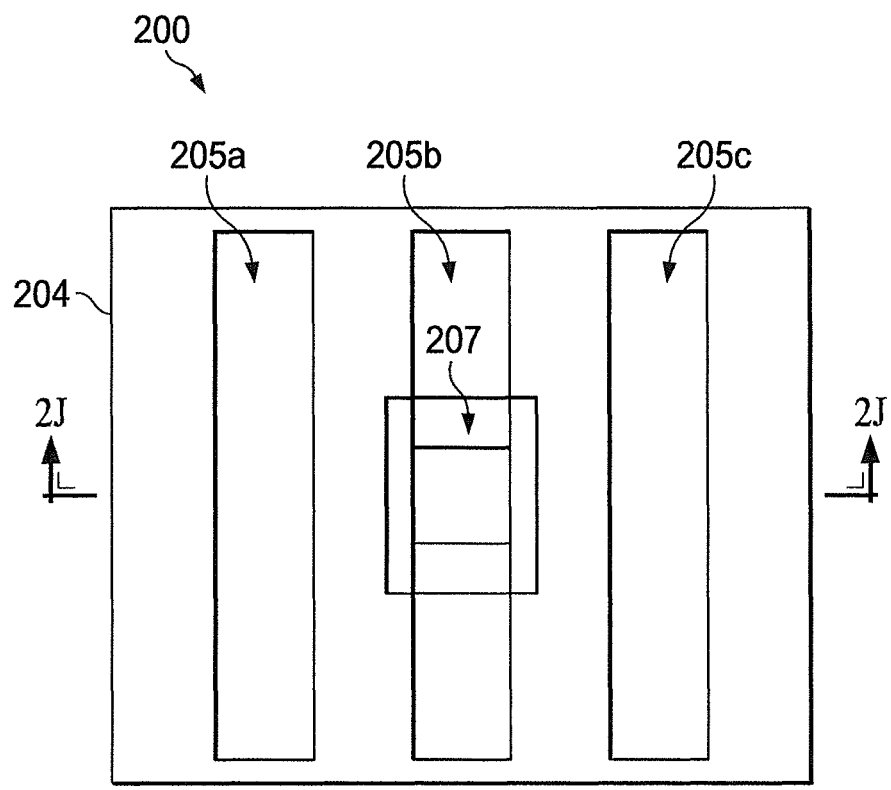
Figure 2J:
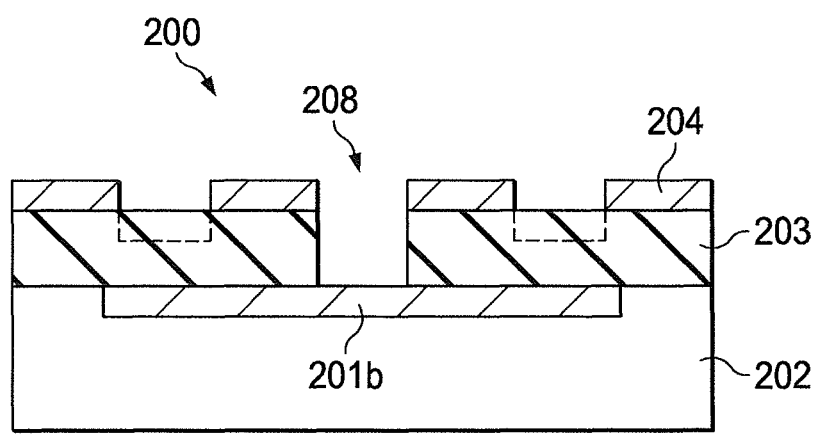
Figure 3I:
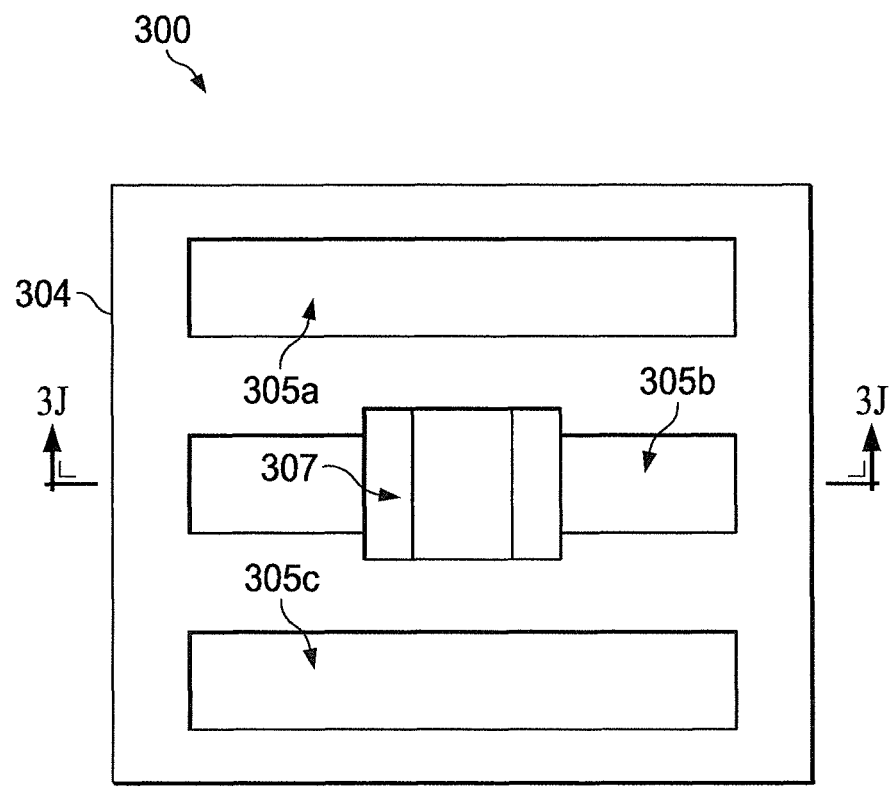
Figure 3J:
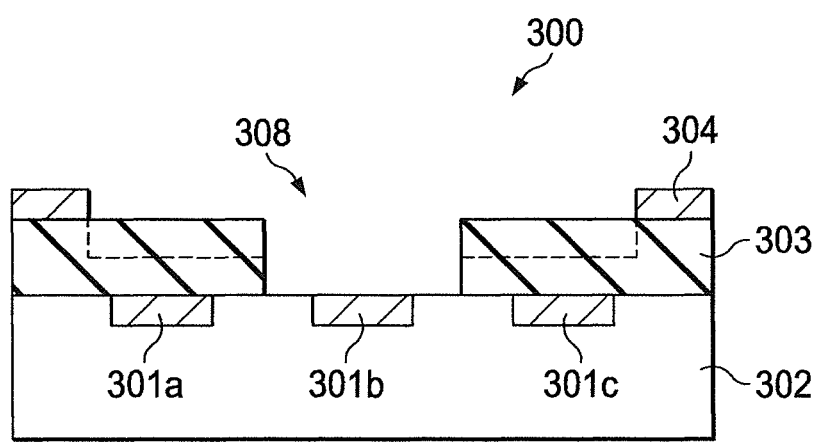

FIGS. 2I and 3I are plan views of the portions 200, 300 of an integrated circuit after removal of the etch mask, and FIGS. 2J and 3J are side sectional views of the structure of FIGS. 2I and 3I, respectively, each taken at section line J-J. Once the etch mask 206, 306 is removed, the rectangular via openings 208, 308 and the openings 205a-205c, 305a-305c through hard mask 204, 304 are left exposed. Trenches for the interconnects within the upper metallization level MET3 may be etched through the hard mask into the dielectric 203, 303, as shown in phantom in FIGS. 2J and 3J. At that time, any remaining dielectric at the bottom of openings 208, 308 may be concurrently removed as described above, exposing portions of interconnects 201b, 301b (and optionally slightly over etching, as described above). The openings 208, 308 and the trenches for the upper metallization level interconnects may be filled with conductive material that is then patterned (e.g., by chemical mechanical polishing) to form the vias and level 3 metallization interconnects.

Figure 4:
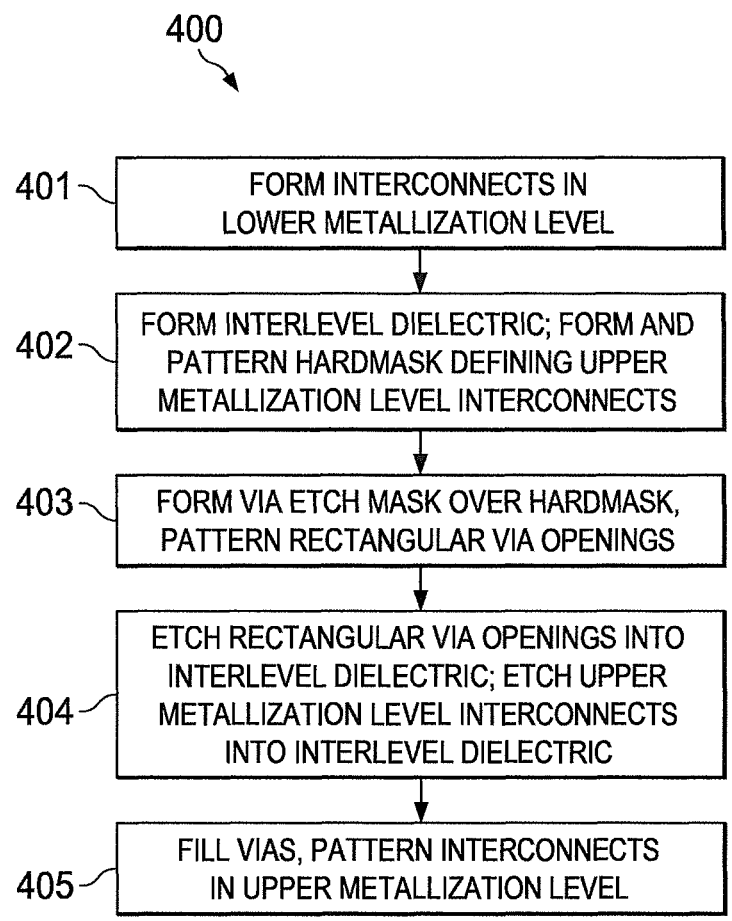
FIG. 4 is a high level flow diagram for a process of forming single rectangular vias between interconnects within different metallization levels of an integrated circuit according to one embodiment of the present disclosure.

FIG. 4 is a high level flow diagram for a process 400 of forming single rectangular vias between interconnects within different metallization levels of an integrated circuit according to one embodiment of the present disclosure. The process 400 may be performed as part of an overall process for forming an integrated circuit. The process begins with forming a metal layer and patterning the metal layer to form lower interconnects (step 401). A plurality of interconnects can be formed and patterned concurrently within a single metallization level. The interconnects within the lower metallization level may be formed by depositing a metal layer and then patterning the metal with a chemical or plasma etch or by chemical mechanical polishing (CMP).

An interlevel dielectric is formed over the lower interconnect(s) (step 402), and a hardmask is formed and patterned over the interlevel dielectric. The pattern within the hardmask defines the upper metallization layer interconnects. An etch mask for the rectangular via openings of the type described above is then formed over the etch mask (step 403), and the pattern for the via openings is transferred to the etch mask. The rectangular via openings are then etched into (through or partially through) the interlevel dielectric (step 404), through the interconnect pattern in the hard mask. As described above, the via openings can be formed by a tightly controlled etch, which may include the use of an etch stop layer within the interlevel dielectric. As part of (or during the same etch step, after removing the etch mask but not the hard mask) completing etch of the via openings to expose portions of the interconnects within the lower metallization level, the pattern for the upper metallization level may be etched into the interlevel dielectric. The vias (and upper metallization level interconnects) may then be formed as discussed above by depositing and patterning a barrier/seed material and then forming and patterning a material constituting the bulk of the completed vias (and interconnects) (step 405).

Use of a rectangular via aligned with the upper interconnect of a pair of interconnects to be electrically connected reduces the number of routing tracks that are blocked by the via compared to the blockage resulting from redundant vias, improving the robustness of the electrical connection between the interconnects over a single square interconnect. Based on the smaller lateral dimension required over redundant vias, greater flexibility exists in either designing a circuit to include rectangular vias or in adding rectangular vias in place of single square vias after signal routing in the circuit design is complete.

The following definitions apply to certain words and phrases used throughout this patent document: the term "on" means in direct contact with, while the term "over" encompasses either "on" or separated by one or more intervening materials; the terms "include" and "comprise," as well as derivatives thereof, mean inclusion without limitation; the term "or," is inclusive, meaning and/or; and the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. Definitions for other words and phrases are provided throughout this patent document; those of ordinary skill in the art should understand that in many if not most instances, such definitions apply to prior as well as future uses of such defined words and phrases.

Although the present disclosure has been described with exemplary embodiments, various changes and modifications may be suggested to one skilled in the art. It is intended that the present disclosure encompass such changes and modifications as fall within the scope of the appended claims.

What is claimed is:

1. An integrated circuit structure, comprising:
   a lower interconnect within a first metallization level;
   an upper interconnect within a second metallization level above the first metallization level; and
   a via electrically connecting the upper and lower interconnects, the via having a rectangular planform with a long dimension aligned with a length of the upper interconnect, wherein:
   a width of the rectangular planform equals a width of the upper interconnect; and
   the long dimension of the rectangular planform is twice a width of the lower interconnect such that the rectangular planform extends past edges of the lower interconnect.

2. The integrated circuit structure of claim 1, wherein the via has sloped sidewalls.

3. The integrated circuit structure of claim 1, wherein a bottom of the via is aligned with an upper surface of the lower interconnect.

4. The integrated circuit structure of claim 1, wherein a bottom of the via includes portions below an upper surface of the lower interconnect.

5. The integrated circuit structure of claim 1, wherein the upper interconnect extends past a width of the lower interconnect by at least an amount by which the long dimension of the rectangular planform extends past the width of the lower interconnect.

6. The integrated circuit structure of claim 1, wherein the via extends below a surface of the lower interconnect where the rectangular planform extends past edges of the lower interconnect.

7. The integrated circuit structure of claim 1, wherein the lower interconnect and the upper interconnect are perpendicular to each other.

8. The integrated circuit structure of claim 7, wherein the upper interconnect extends past opposite edges of the via.

9. An integrated circuit structure, comprising:
   a lower interconnect within a first metallization level, the lower interconnect having a length extending in a first direction;
   an upper interconnect within a second metallization level above the first metallization level, the upper interconnect having a length extending in a second direction perpendicular to the first direction; and
   a via electrically and physically connecting the upper and lower interconnects, the via having a rectangular planform with a long dimension aligned with a length of the upper interconnect in the second direction, wherein:
   a width of the rectangular planform equals a width of the upper interconnect; and
   the long dimension of the rectangular planform is twice a width of the lower interconnect such that the rectangular planform extends past edges of the lower interconnect in the second direction.

10. The integrated circuit structure of claim 9, wherein the via extends below a surface of the lower interconnect where the rectangular planform extends past edges of the lower interconnect.

11. The integrated circuit structure of claim 9, wherein the upper interconnect extends past opposite edges of the via in the second direction.

12. The integrated circuit structure of claim 9, wherein the via has sloped sidewalls.

13. An integrated circuit structure, comprising:
a lower interconnect within a first metallization level, the lower interconnect having a length extending in a first direction and a shorter width extending in a second direction perpendicular to the first direction;
an upper interconnect within a second metallization level above the first metallization level, the upper interconnect having a length extending in the second direction and a shorter width extending in the first direction; and
a via electrically and physically connecting the upper and lower interconnects, the via having a height extending from the lower interconnect to the upper interconnect, a length, and a width, wherein the length of the via is aligned with the length of the upper interconnect in the second direction, wherein:
the width of the via equals the width of the upper interconnect; and
the length of the via extends past opposite edges of the lower interconnect in the second direction.

14. The integrated circuit structure of claim 13, wherein the via extends below a surface of the lower interconnect where the via extends past opposite edges of the lower interconnect.

15. The integrated circuit structure of claim 13, wherein the upper interconnect extends past opposite edges of the via in the second direction.

16. The integrated circuit structure of claim 13, wherein the via has sloped sidewalls.

* * * * *